US012604601B2

(12) United States Patent
Kitano et al.

(10) Patent No.: US 12,604,601 B2
(45) Date of Patent: Apr. 14, 2026

(54) LIGHT-EMITTING ELEMENT, QUANTUM DOT SOLUTION, AND METHOD FOR MANUFACTURING LIGHT-EMITTING ELEMENT

(71) Applicant: SHARP KABUSHIKI KAISHA, Sakai (JP)

(72) Inventors: Keisuke Kitano, Sakai City (JP); Kazuki Goto, Sakai City (JP); Masaki Yamamoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 404 days.

(21) Appl. No.: 18/287,538

(22) PCT Filed: May 20, 2021

(86) PCT No.: PCT/JP2021/019163
§ 371 (c)(1),
(2) Date: Oct. 19, 2023

(87) PCT Pub. No.: WO2022/244186
PCT Pub. Date: Nov. 24, 2022

(65) Prior Publication Data
US 2024/0224561 A1 Jul. 4, 2024

(51) Int. Cl.
*H10K 50/115* (2023.01)
*H10K 59/131* (2023.01)

(52) U.S. Cl.
CPC ......... *H10K 50/115* (2023.02); *H10K 59/131* (2023.02)

(58) Field of Classification Search
None
See application file for complete search history.

(56) References Cited

U.S. PATENT DOCUMENTS

| | | | | |
|---|---|---|---|---|
| 2017/0012180 | A1 | 1/2017 | Baesjou et al. | |
| 2017/0029693 | A1 | 2/2017 | Gruhlke et al. | |
| 2019/0393435 | A1 | 12/2019 | Kim et al. | |
| 2022/0011664 | A1* | 1/2022 | Talapin | G03F 7/32 |
| 2022/0098481 | A1* | 3/2022 | Jung | C09K 11/70 |
| 2023/0354631 | A1* | 11/2023 | Jung | H10K 50/165 |
| 2024/0067872 | A1* | 2/2024 | Wang | C09K 11/59 |

FOREIGN PATENT DOCUMENTS

JP 2017-505842 A 2/2017

* cited by examiner

*Primary Examiner* — Asok K Sarkar
(74) *Attorney, Agent, or Firm* — ScienBiziP, P.C.

(57) ABSTRACT

A light-emitting element according to the disclosure includes a cathode, an anode, and a light-emitting layer provided between the cathode and the anode. The light-emitting layer includes a quantum dot, a plurality of first ions, and a plurality of second ions. Each of the first ions is an anion, and each of the second ions is a cation. The anion is any one of $S^{2-}$, $Se^{2-}$, and $Te^{2-}$, and the cation is composed of a nonmetallic element.

20 Claims, 10 Drawing Sheets

LIGHT-EMITTING ELEMENT, QUANTUM DOT SOLUTION, AND METHOD FOR MANUFACTURING LIGHT-EMITTING ELEMENT

TECHNICAL FIELD

The disclosure relates to a light-emitting element, a quantum dot solution, and a method for manufacturing the light-emitting element.

BACKGROUND ART

PTLs 1 and 2 disclose an inorganic ligand that protects the surface of a quantum dot.

CITATION LIST

Patent Literature

PTL 1: JP 2017-505842 T
PTL 2: US 2019/0393435 A1

SUMMARY OF INVENTION

Technical Problem

The light-emitting elements prepared by the methods disclosed in PTLs 1 and 2 have low external quantum efficiency (EQE), which is undesirable.

Solution to Problem

According to an aspect of the disclosure, there is provided a light-emitting element including an anode, a cathode, and a light-emitting layer provided between the anode and the cathode. The light-emitting layer includes a quantum dot, a plurality of first ions, and a plurality of second ions. Each of the plurality of first ions is an anion and each of the plurality of second ions is a cation. The anion is any one of $S^{2-}$, $Se^{2-}$, and $Te^{2-}$, and the cation is composed of a nonmetallic element.

Advantageous Effects of Disclosure

According to an aspect of the disclosure, EQE of a light-emitting element can be improved.

DESCRIPTION OF EMBODIMENTS

First Embodiment

Light-Emitting Element

Figure 1:
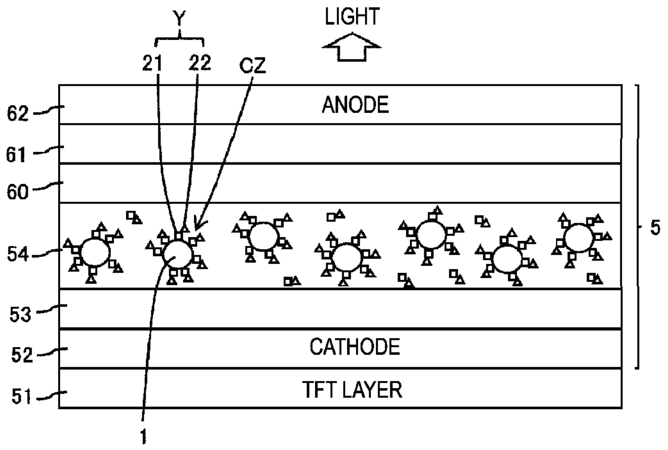
FIG. 1 is a cross-sectional view schematically illustrating an example of a light-emitting element according to an embodiment of the disclosure.

FIG. 1 is a cross-sectional view schematically illustrating an example of a light-emitting element 5 according to a first embodiment of the disclosure. The light-emitting element 5 has an inverted structure and includes, for example, a cathode 52, an electron transport layer 53, a light-emitting layer 54, a hole transport layer 60, a hole injection layer 61, and an anode 62 in this order. An electron blocking layer and a positive hole blocking layer may further be provided. The cathode 52 is formed on a TFT layer 51. Although not illustrated, a drive transistor, a capacitance element, and the like are formed in the TFT layer 51.

The cathode 52 is an electrode containing a conductive material. The cathode 52 is, for example, a metal film of a metal having a relatively low work function such as Al or Ag, and is formed by vapor deposition, sputtering, or the like.

The electron transport layer 53 is a layer including an electron transport material and having a function of increasing electron transport efficiency to the light-emitting layer 54. As a material of the electron transport layer 53, a ZnO-based inorganic material such as ZnO, IZO, ZAO, or ZnMgO, or $TiO_2$ can be used. However, no limitation is intended, and the electron transport layer 53 may contain an organic material. The electron transport layer 55 is formed by, for example, sputtering or application of a colloidal solution.

The light-emitting layer 54 includes a plurality of quantum dots 1, a plurality of first ions 21, and a plurality of second ions 22. The quantum dot 1 is a light-emitting body that is excited through recombination of positive holes in the valence band level and electrons in the conduction band level to emit light. Since light emitted from the quantum dot 1 has a narrower spectrum due to a quantum confinement effect, it is possible to achieve light emission with relatively deep chromaticity. The particle size of the quantum dot 1 is on the nano order (i.e., 1 nm or more and less than 1000 nm), and is typically 10 nm or more and less than 1000 nm.

The quantum dot 1 may be a core type, a core-shell type, a core-multishell type, or the like, but no limitation is intended. The shape of the quantum dot 1 is a spherical shape, a rod shape, or a flat plate shape, but no limitation is intended. Examples of the material of the quantum dot 1 (materials of the core/shell) may include CdSe/CdS, InP/ZnS, ZnSe/ZnS, and CIGS/ZnS.

In the light-emitting layer 54, at least some of the plurality of first ions 21 are coordinated to the quantum dot 1. The term “coordination” means a state in which the first ions 21 are bonded to the surface of the quantum dot 1, and the type of bonding is not limited. The first ion 21 is an anion that is any one of $S^{2-}$, $Se^{2-}$, and $Te^{2-}$ The second ion 22 is a cation composed of a nonmetallic element (e.g., ammonium ions). The first ion 21 may be bonded to the second ion 22 to form a compound Y (e.g., ammonium sulfide) in the light-emitting layer 54. In other words, the light-emitting layer 54 may include capping agents CZ made of the compounds Y surrounding the quantum dot 1.

The cation constituting the second ion 22 is preferably a substance that reacts with the anion constituting the first ion 21 to become a gas when heated. The heating temperature is a predetermined temperature (e.g., from 100 to 130 degrees) higher than room temperature. That is, the compound Y made of the anion constituting the first ion 21 and the cation constituting the second ion 22 is preferably a substance that is thermally decomposed and vaporized.

The cation constituting the second ion 22 may be a monovalent ion including nitrogen (N) or phosphorus (P) and hydrogen (H) as elements. Examples of such cations include ammonium ions (unsubstituted ammonium ions, primary to quaternary ammonium ions). For example, an unsubstituted ammonium ion ($NH_4^+$) reacts with an anion (e.g., a sulfide ion) when heated to form ammonia ($NH_3$), which is a gas at normal temperature and pressure. In addition to ammonium ions, imidazole ions and phosphonium ions can be used. From the above, the cation constituting the second ion 22 may be a substance represented by any one of the following structural formulae (1) to (3).

[Chem. 1]

(1)

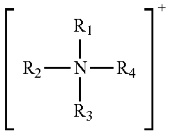

(2)

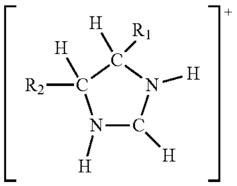

(3)

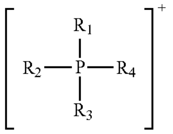

In the structural formulae (1) to (3) above, H represents a hydrogen atom, N represents a nitrogen atom, each of $R_1$ to $R_4$ independently represents a hydrogen atom, an alkyl group, or an aryl group, and P represents a phosphorus atom.

The above structural formula (1) represents an unsubstituted or primary to quaternary ammonium ion. The above structural formula (2) represents an unsubstituted or primary to secondary imidazole ion. The above structural formula (3) represents an unsubstituted or primary to quaternary phosphonium ion.

Since the first ions 21 ($S^{2-}$, $Se^{2-}$, and $Te^{2-}$) are negative divalent ions, they are attracted to the positively charged surface of the quantum dot 1. Accordingly, the first ions 21 can be coordinated to the quantum dots 1, and a distance between the quantum dots 1 is maintained by an electrical repulsive force. Since the first ions 21 are inorganic monoatomic ions, they have higher stability than organic ions and inorganic polyatomic ions. Accordingly, the first ions 21 can stably protect the surface of the quantum dot 1. To efficiently coordinate the first ions 21 to the surface of the quantum dot 1, it is desirable that the anion constituting the first ion 21 contains an element common to the substance constituting the surface of the quantum dot 1. For example, when the core/shell of the quantum dot 1 is ZnSe/ZnS, a sulfide ion ($S^{2-}$) can be selected as the anion.

As illustrated in FIG. 1, the hole transport layer 60 is a layer including a hole transport material and having the function of increasing hole transport efficiency to the light-emitting layer 54. When an organic material is used for the hole transport layer 60, the organic material may be an organic material having a HOMO level matching that of the light-emitting layer material, such as PVK, TFB, or Poly-TPD. The hole transport layer 60 may be made of a metal oxide having a VBM matching that of the light-emitting layer material, such as NiO, MgNiO, or LaNiO, or a semiconductor material such as p-type ZnO.

The hole injection layer 61 is a layer having a function of increasing the hole injection efficiency to the hole transport layer 60 and, for example, an organic material such as a mixture of PEDOT and polystyrene sulfonic acid (PSS) can be used.

The anode 62 is an electrode containing a conductive material. The anode 62 may be made of a transparent conductive material, and in this case, the anode 62 preferably contains indium tin oxide (ITO) in consideration of level matching with the hole injection layer 61. The anode 62 can be formed by sputtering or the like.

The light-emitting element 5 includes the electron transport layer 53 containing ZnO and the light-emitting layer 54 formed on the electron transport layer 53, and a cathode-side portion of the light-emitting layer 54 may have a higher anion concentration than an anode-side portion of the light-emitting layer 54. With this configuration, electrons can be efficiently transported from the cathode 52 to the light-emitting layer 54.

The light-emitting element 5 in FIG. 1 is a top-emitting type element, but may be a bottom-emitting type element. The light-emitting element 5 has an inverted structure in which the cathode serves as the lower electrode, but may have a standard structure in which the anode serves as the lower electrode.

Quantum Dot Solution

Figure 2:
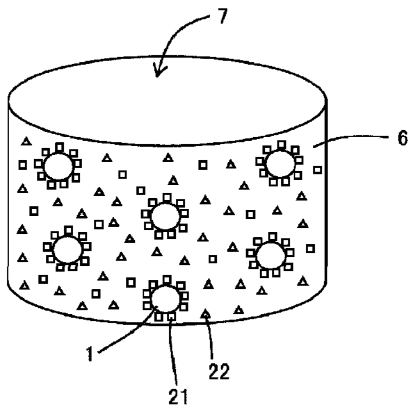
FIG. 2 is a schematic view illustrating an example of a quantum dot solution according to an embodiment of the disclosure.
Figure 3:
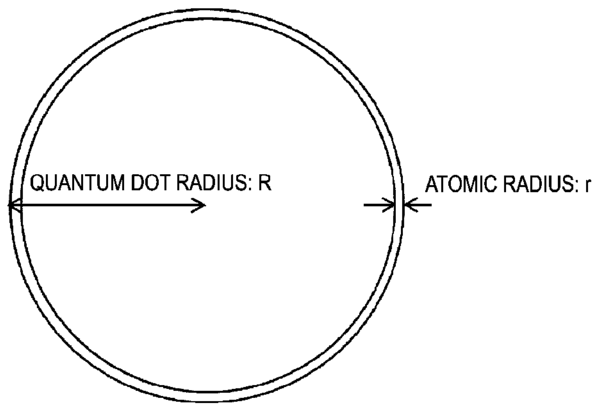
FIG. 3 is a schematic cross-sectional view of a quantum dot according to an embodiment of the disclosure.

FIG. 2 is a schematic view illustrating an example of a quantum dot solution 7 according to the first embodiment of the disclosure. FIG. 3 is a schematic view schematically illustrating an example of a cross section when the quantum dot 1 according to the first embodiment is a sphere.

As illustrated in FIG. 2, the quantum dot solution 7 includes a solvent 6, the quantum dots 1, and capping agents (ligand agents). The capping agents (e.g., ammonium sulfide) are present in the quantum dot solution 7 as the first ions 21 (e.g., $NH_4^+$) which are anions and the second ions 22 (e.g., $S^{2-}$) which are cations. In the quantum dot solution 7, at least some of the first ions 21 are coordinated to the quantum dots 1.

The solvent 6 is a polar solvent other than water and is liquid at room temperature. The solvent 6 is preferably, for example, a non-aqueous polar solvent such as dimethyl sulfoxide (DMSO) or an amphoteric solvent such as methanol or ethanol. A material in which the quantum dots 1, to which the first ions 21 are coordinated, are easily dispersed is preferably selected as the solvent 6. For example, the substance constituting the solvent 6 may contain an element (a sulfur atom S when the solvent is DMSO) common to the anion constituting the first ion 21.

The quantum dot solution 7 includes an excess of the first ions 21 to maintain the intervals between the quantum dots and protect the surfaces of the quantum dots. Specifically, the molar ratio of the first ion 21 to the material of the quantum dot 1 is from 5.6 to 100. In this way, the quantum dots 1 can be uniformly dispersed in the solvent 6.

Note that in FIG. 3, the number of atoms located on the surface of the quantum dot can be approximated to $4\pi R^2 r \div 4\pi r^3/3$, and if R=5 nm and r=0.1 nm, the number of atoms located on the surface of the quantum dot is roughly estimated to be about 7500. In this model, the number of anions (ligands) per quantum dot 1 is 7500 or less.

Figure 4:
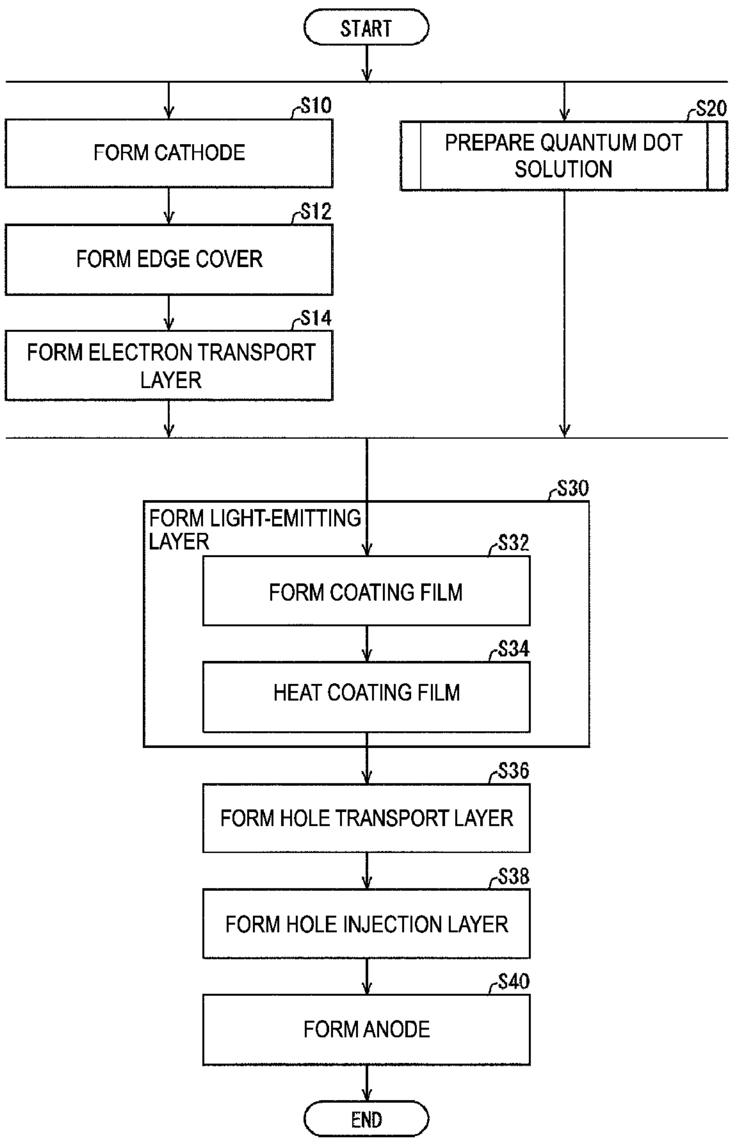
FIG. 4 is a flowchart illustrating an example of a method for manufacturing the light-emitting element according to an embodiment of the disclosure.
Figure 5:
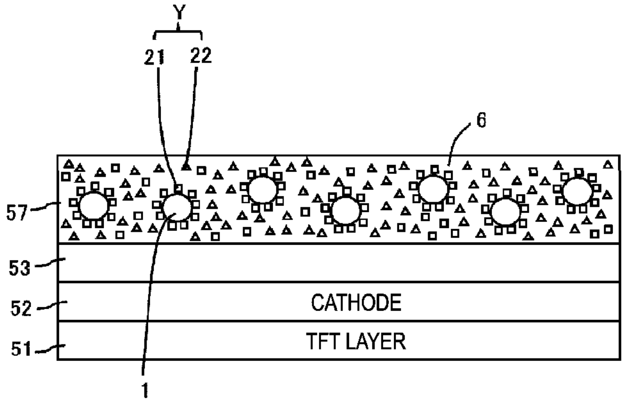
FIG. 5 is a cross-sectional view illustrating an example of the method for manufacturing the light-emitting element according to an embodiment of the disclosure.

Hereinafter, an example of a method for manufacturing the light-emitting element 5 according to the first embodiment will be described with reference to FIG. 4 to FIG. 6. FIG. 4 is a flowchart illustrating an example of the method for manufacturing the light-emitting element 5 according to the first embodiment. Each of FIG. 5 and FIG. 6 is a cross-sectional view illustrating an example of the method for manufacturing the light-emitting element 5 according to the first embodiment of the disclosure.

As illustrated in FIG. 1 and FIG. 4, first, the cathode 52 is formed on the TFT layer 51 (step S10), an edge cover (not illustrated) covering an edge of the cathode 52 is formed (step S12), and the electron transport layer 53 is formed (step S14). At the same time, the quantum dot solution 7 is prepared (step S20). The quantum dot solution 7 includes the solvent 6, the quantum dots 1, and the capping agent (ligand agent), and the capping agent (e.g., ammonium sulfide) is present in the quantum dot solution 7 as the cation (e.g., $NH_4^+$) and the anion (e.g., $S_2^-$).

Subsequently, the light-emitting layer 54 is formed using the quantum dot solution 7 (step S30). As illustrated in FIG. 5, in step S30, first, the quantum dot solution 7 is applied or sprayed onto the electron transport layer 53 to form a coating film 57 of the quantum dot solution 7 (step S32). As a method for forming the coating film 57, any method such as a bar coating method, a spin coating method, or an ink jet method may be appropriately selected.

Figure 6:
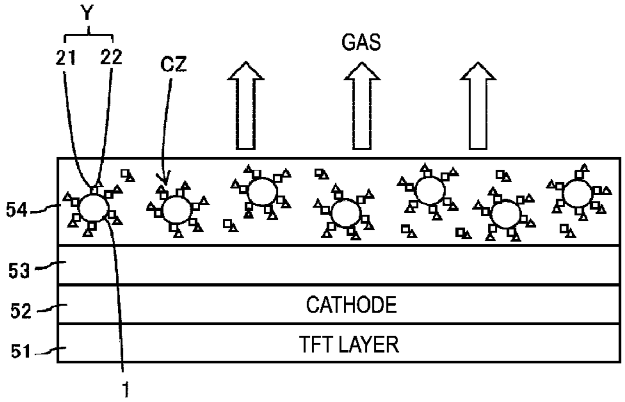
FIG. 6 is a cross-sectional view illustrating an example of the method for manufacturing the light-emitting element according to an embodiment of the disclosure.

As illustrated in FIG. 6, next, the coating film 57 is heated to a predetermined temperature exceeding room temperature (step S34). By heating, the solvent 6 is volatilized and lost from the coating film 57, and as a result, the light-emitting layer 54 is formed from the coating film 57. When dimethyl sulfoxide (DMSO) is used as the solvent 6, heating is performed at 120° C. for 10 minutes or more in step S34. When heated in this manner, some of the first ions 21 and some of the second ions 22 react with each other to become a gas and are lost (removed and do not remain) from the light-emitting layer 54. Since the first ions 21 not coordinated to the quantum dots 1 easily react with the second ions 22, it is presumed that they are unlikely to remain in the light-emitting layer 54. On the other hand, since the first ions 21 coordinated to the quantum dots 1 are unlikely to react with the second ions 22, it is presumed that they are likely to remain in the light-emitting layer 54.

After step S30, the hole transport layer 60 is formed (step S36), then the hole injection layer 61 is formed (step S38), and then the anode 62 is formed (step S40). As described above, the light-emitting element 5 illustrated in FIG. 1 is manufactured.

Comparison Between Comparative Example and Example

The light-emitting element 105 of a comparative example and the light-emitting element 5 according to an example of the disclosure were manufactured to have the configurations shown in the following Table 1 so as to emit red light having substantially the same wavelength.

TABLE 1

| | | Example | Comparative example |
|---|---|---|---|
| Cathode | | Al | Al |
| Electron transport layer | | ZnO | ZnO |
| Light-emitting layer | Quantum dot | CdSe | CdSe |
| | Anion | $S^{2-}$ | $S^{2-}$ |
| | Cation | $NH_4^+$ | $Na^+$ |
| Hole transport layer | | Poly-TPD | Poly-TPD |
| Hole injection layer | | PEDOT:PSS | PEDOT:PSS |
| Anode | | ITO | ITO |

In Table 1, "PEDOT:PSS" indicates a mixture of PEDOT and PSS.

The light-emitting element 5 according to the example was manufactured by the method described above with reference to FIG. 4 to FIG. 6. In the quantum dot solution 7 according to the example, ammonium sulfide $(NH_4)^2S$ was used as a supply source of $S_2^-$ (capping agent or ligand agent), and DMSO was used as the solvent 6 of the quantum dot solution 7. The molar ratio of the capping agent (e.g., ammonium sulfide) to the quantum dot material (e.g., core CdSe/shell ZnS) was 2, and the mass ratio of the second ion (e.g., cation $NH_4$+) to the material of the quantum dot 1 was 0.9 or more. The heating in step S34 was performed by baking at 120° C. for 15 minutes.

On the other hand, a light-emitting element 105 of the comparative example was manufactured by the same method as that of the light-emitting element 5 according to the example except that sodium sulfide $Na_2S$ was used as the supply source of $S_2^-$. That is, the light-emitting element 5 of the example contains unsubstituted ammonium ions as cations, and the light-emitting element 105 of the comparative example contains sodium ions as cations.

Figure 7:
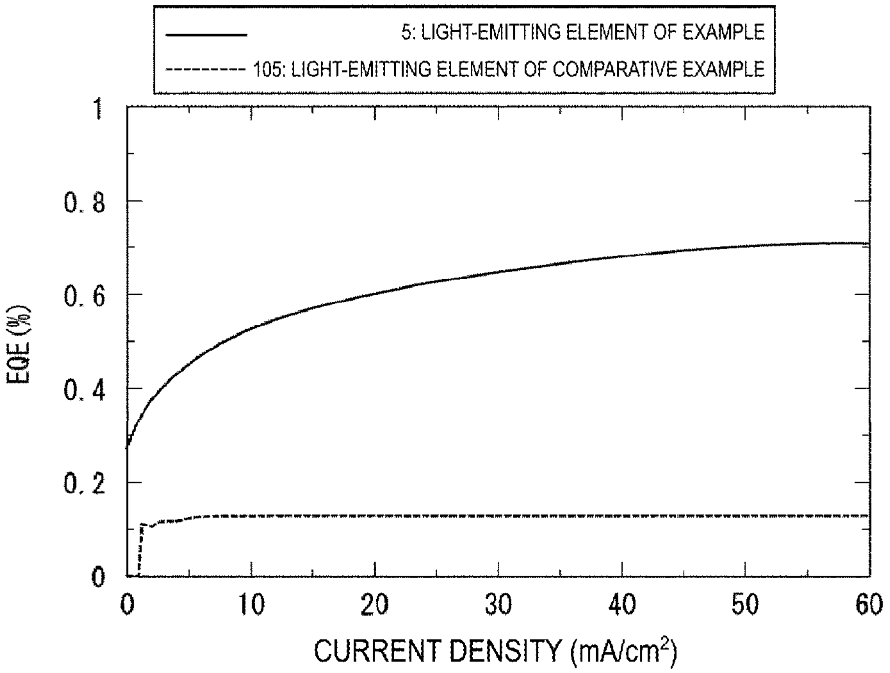
FIG. 7 is a graph showing EQE relative to current density of a light-emitting element of an example and a light-emitting element of a comparative example.
Figure 8:
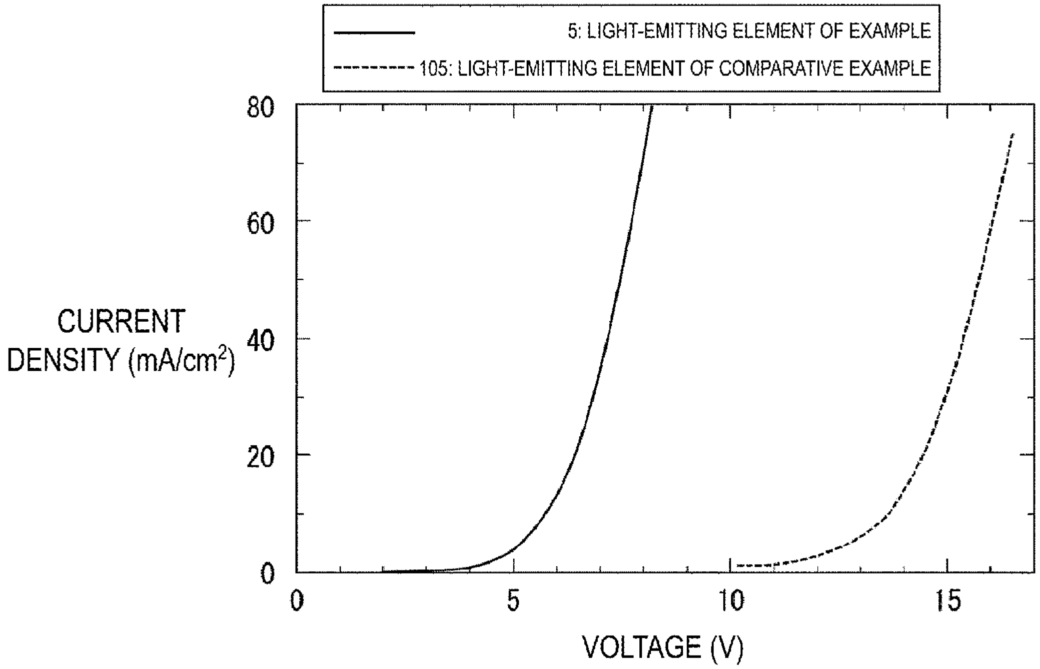
FIG. 8 is a graph showing a current density of a flowing current relative to an applied voltage in the light-emitting element of the example and the light-emitting element of the comparative example.
Figure 9:
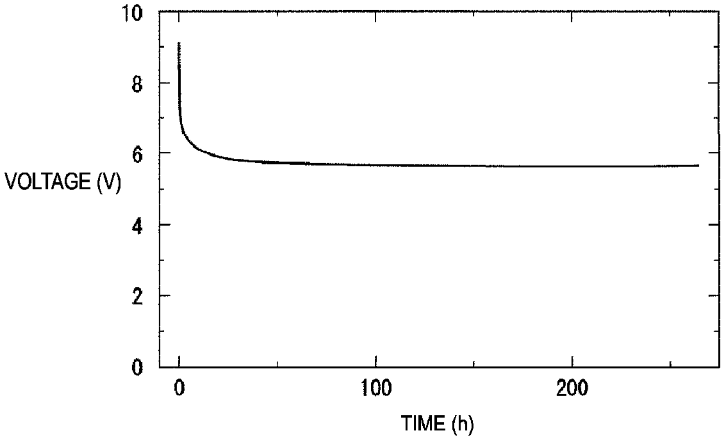
FIG. 9 is a graph showing the progress of a reliability test performed on the light-emitting element of the example.

FIG. 7 is a graph showing EQE corresponding to current density of the light-emitting element 5 of the example and the light-emitting element 105 of the comparative example. FIG. 8 is a graph showing a current density of a flowing current relative to an applied voltage of the light-emitting element 5 of the example and the light-emitting element 105 of the comparative example. FIG. 9 is a graph showing the progress of a reliability test performed on the light-emitting element 5 of the example.

First, for each of the light-emitting element 5 of the example and the light-emitting element 105 of the comparative example, the application voltage was swept so that a current with a current density in a range from 0 mA/cm$^2$ to 80 mA/cm$^2$ was applied, the light emission intensity was measured, and the EQE was calculated.

As shown in FIG. 7, at the same current density, the EQE of the light-emitting element 5 of the example was higher than the EQE of the light-emitting element 105 of the comparative example, at about 6 times higher. As shown in FIG. 8, at the same current density, a voltage required to apply current to the light-emitting element 5 of the example was smaller than a voltage required to apply current to the light-emitting element 105 of the comparative example. For example, the voltage required to apply a constant current of 10 mA/cm$^2$ was 14 V for the light-emitting element 105 of the comparative example and 6 V for the light-emitting element 5 of the example.

A current of 10 mA/cm$^2$ was continuously applied to the light-emitting element 5 of the example and the light-emitting element 105 of the comparative example to perform a reliability test for testing service life. The graph of FIG. 9 shows the voltage that is applied to the light-emitting element 5 of the example to continuously apply a constant current of 10 $mA/cm^2$ with respect to the passage of time in the reliability test.

As shown in FIG. 9, the light-emitting element 5 of the example continued to emit light for 200 hours or more, the voltage was maintained at about 6 V, and a decrease in the external quantum efficiency was 5% or less. On the other hand, the light-emitting element 105 of the comparative example turned off after about 10 minutes of emitting light.

As described above, compared to the light-emitting element 105 of the comparative example, the light-emitting element 5 of the example had the effect of improving EQE, reducing voltage, and extending lifetime. It is presumed that such an effect is derived from the difference in cations. Sodium ions consist of metallic elements whereas ammonium ions consist of nonmetallic elements. In the comparative example, it is presumed that when the coating film is baked, excessive anions ($S_2^-$) are bonded to cations ($Na^+$) to form $Na_2S$, $Na_2S$ remaining in the light-emitting layer prevents charge transfer in the light-emitting layer, and heat generated thereby shortens the lifetime of the quantum dots.

On the other hand, in the example, when the coating film is baked in step S34, the excessive first ions 21 (e.g., anions $S_2^-$) react with the second ions 22 (e.g., cations $NH_4^+$) to become gas and are removed from the light-emitting layer 54, thereby improving the carrier injection efficiency and improving the EQE.

Second Embodiment

Figure 10:
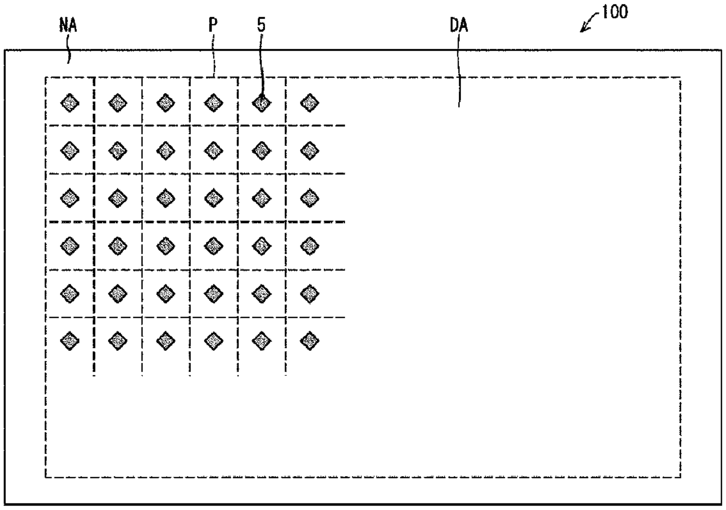
FIG. 10 is a plan view illustrating a schematic configuration of a display device according to a second embodiment of the disclosure.

FIG. 10 is a plan view illustrating a schematic configuration of a display device according to a second embodiment of the disclosure. A display device 200 according to the second embodiment includes a display region DA and a frame region NA surrounding the display region DA. A plurality of subpixels P are formed in the display region DA. Each subpixel P includes a pixel circuit (not illustrated) and the light-emitting element 5 connected to the pixel circuit. The pixel circuit is formed in the TFT layer 51 illustrated in FIG. 1. Although not illustrated, the pixel circuit is connected to a light emission control circuit, a scanning signal line drive circuit, and a data signal line drive circuit.

The disclosure is not limited to the embodiments described above. Embodiments obtained by appropriately combining technical approaches disclosed in different embodiments also fall within the technical scope of the disclosure. Furthermore, novel technical features can be formed by combining the technical approaches disclosed in each of the embodiments.

The invention claimed is:

1. A light-emitting element comprising:
an anode;
a cathode; and
a light-emitting layer provided between the anode and the cathode,
wherein the light-emitting layer includes a quantum dot, a plurality of first ions, and a plurality of second ions,
each of the plurality of first ions is an anion and each of the plurality of second ions is a cation,
the anion is any one of $S^{2-}$, $Se^{2-}$, and $Te^{2-}$, and
the cation is composed of a nonmetallic element.

2. The light-emitting element according to claim 1, wherein at least some of the plurality of first ions are coordinated to the quantum dot.

3. The light-emitting element according to claim 1, wherein the light-emitting layer includes a compound formed by bonding at least the some of the plurality of first ions and at least some of the plurality of second ions.

4. The light-emitting element according to claim 3, wherein the compound is a solid or a liquid at room temperature and becomes a gas by thermal decomposition.

5. The light-emitting element according to claim 1, wherein a substance constituting the quantum dot includes an element common to the anion.

6. The light-emitting element according to claim 1, wherein the cation is a monovalent ion including N or P and H as elements.

7. The light-emitting element according to claim 1, further comprising:
an electron transport layer including ZnO,
wherein the light-emitting layer is formed on the electron transport layer.

8. The light-emitting element according to claim 7, wherein the electron transport layer is disposed between the cathode and the light-emitting layer.

9. The light-emitting element according to claim 1, wherein a concentration of the anion is higher in a cathode-side portion of the light-emitting layer than in an anode-side portion of the light-emitting layer.

10. The light-emitting element according to claim 1, wherein the cation is any one of an ammonium ion, an imidazole ion, and a phosphonium ion.

11. The light-emitting element according to claim 1, wherein a decrease in external quantum efficiency with respect to light emission for 200 hours at a constant current of 10 $mA/cm^2$ is 5% or less.

12. A display device comprising:
the light-emitting element according to claim 1.

13. A light-emitting element comprising:
an anode;
a cathode; and
a light-emitting layer provided between the anode and the cathode,
wherein the light-emitting layer includes a quantum dot and a capping agent,
the capping agent is composed of a compound formed by bonding a cation and an anion,
the anion is any one of $S^{2-}$, $Se^{2-}$, and $Te^{2-}$, and
the cation is composed of a nonmetallic element.

14. A quantum dot solution comprising:
a solvent;
a quantum dot;
a plurality of first ions; and
a plurality of second ions,
wherein each of the plurality of first ions is an anion and each of the plurality of second ions is a cation,
the anion is any one of $S^{2-}$, $Se^{2-}$, and $Te^{2-}$, and
the cation is composed of a nonmetallic element.

15. The quantum dot solution according to claim 13, wherein at least some of the plurality of first ions are coordinated to the quantum dot.

16. The quantum dot solution according to claim 14, wherein a substance formed by bonding the cation and the anion is a solid or a liquid at normal temperature and normal pressure, and is thermally decomposed to become a gas by heating at a predetermined temperature higher than normal temperature.

17. The quantum dot solution according to claim 16, wherein the predetermined temperature is from 100 to 130 degrees.

18. The quantum dot solution according to claim 14, wherein the cation is a monovalent ion including N or P and H as elements.

19. The quantum dot solution according to claim 14, wherein the cation is any one of an ammonium ion, an imidazole ion, and a phosphonium ion.

20. The quantum dot solution according to claim 14, wherein a mass ratio of the cation to a material of the quantum dot is 0.9 or more.

* * * * *